(12) United States Patent
Aoki

(10) Patent No.: US 6,181,592 B1
(45) Date of Patent: Jan. 30, 2001

(54) CONTENT ADDRESSABLE MEMORY

(75) Inventor: Tomonari Aoki, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/484,276

(22) Filed: Jan. 18, 2000

(30) Foreign Application Priority Data

Jan. 18, 1999 (JP) .................................................. 11-009800

(51) Int. Cl.[7] .................................................. G11C 15/00
(52) U.S. Cl. .................................................. 365/49
(58) Field of Search .................................................. 365/49

(56) References Cited

U.S. PATENT DOCUMENTS

| | | | |
|---|---|---|---|
| 5,619,446 | * | 4/1997 | Yoneda et al. ........................... 365/49 |
| 5,726,942 | * | 3/1998 | Yoneda et al. ........................... 365/49 |
| 5,973,950 | * | 10/1999 | Shindo .................................... 365/49 |
| 5,999,434 | * | 12/1999 | Yoneda et al. ........................... 365/49 |

FOREIGN PATENT DOCUMENTS 9-180468    7/1997  (JP) .
289591     10/1998  (JP) .
162179      6/1999  (JP) .

* cited by examiner

*Primary Examiner*—Trong Phan
(74) *Attorney, Agent, or Firm*—Young & Thompson

(57) ABSTRACT

A memory cell array included in a content addressable memory stores words, as data to be retrieved, respectively at a plurality of addresses, each of which has been assigned a priority in a descending order. When the data is input, each of a plurality of match detection circuits detects whether the data match the words. A plurality circuit retains, of the retrieval data which have been detected whether the retrieval data matches the corresponding words by the match detection circuits, data stored at an address which is assigned the highest priority, and outputs the data to a retrieval range designation circuit when the following retrieval beings. The retrieval range designation circuit controls each of mask circuits contained in each of the match detection circuits to be in an active state, thereby designating a retrieval range of words within the memory cell array.

10 Claims, 3 Drawing Sheets

11...CONTENT ADDRESSABLE MEMORY
12...PRIORITY CIRCUIT
13...MATCH DETECTION CIRCUIT ARRAY
14...RETRIEVAL RANGE DESIGNATION CIRCUIT
15...ADDRESS ENCODER
16...MEMORY CELL ARRAY
132...MASK CIRCUIT
134...MATCH DETECTION CIRCUIT

CONTENT ADDRESSABLE MEMORY

BACKGROUND OF THE INVENTION

1. Field of the Invention

The present invention relates to a technique for retrieving data, from a plural pieces of data to be retrieved, which matches or is similar to input retrieval data.

2. Description of the Related Art

A content addressable memory (CAM) is a memory which permits desired data to be retrieved from a plural pieces of stored data to be retrieved, based on the contents of input retrieval data.

FIG. 2 is a diagram showing the structure of a conventional content addressable memory. This content addressable memory has a plurality of word data memories $WM_1$ to $WM_n$ respectively having memory cells $MC_1$ to $MC_m$ the number of which corresponds to a number of bits of a word. The memory cells $MC_1$ to $MC_m$ are respectively activated by word lines $W_1$ to $W_n$, thereby the data stored in the memory cells $MC_1$ to $MC_m$ are readout respectively via bit lines $B_1$ to $B_m$. Such data read out from the memory cells $MC_1$ to $MC_m$ via the bit lines $B_1$ to $B_m$ are respectively supplied to a plurality of match detection circuits $CC_1$ to $CC_n$.

Each of the match detection circuits $CC_1$ to $CC_n$ detects whether data on one of the bit lines $B_1$ to $B_m$ matches data from a corresponding one of the memory cells $MC_1$, to $MC_m$, when a circuit operation signal line SC which is common to the entire words is in an active state. Each of the match detection circuits $CC_1$ to $CC_n$ activates its corresponding one of match signal lines $C_1$ to $C_n$, when the data on the entire bit lines $B_1$ to $B_m$ match the data from the memory cells $MC_1$ $MC_m$.

When retrieving data in the content addressable memory, the circuit operation signal line SC needs to be activated, in a state where the word lines $W_1$ to $W_n$ are activated and retrieval data are output to the bit signal lines $B_1$ to $B_m$. In this case, if the data stored in the corresponding one of the word data memories $WM_1$ to $WM_n$, match the retrieval data, its corresponding match detection circuit $C_i$(i=1, 2, , , n) is activated. By doing this, the data which are stored in the corresponding one of the word data memories $WM_1$ to $WM_n$ and which match the retrieval data can be extracted.

The conventional content addressable memory includes the plurality of match detection circuits $CC_1$ to $CC_n$ respectively corresponding to the word data memories $WM_1$ to $WM_n$. In this structure, the conventional content addressable memory can simultaneously detect the entire words whether any one of them corresponds to the retrieval data, resulting in retrieving the data at high speed. In this type of content addressable memory, the match detection circuits $CC_1$ to $CC_n$ are operated all at the same time. In such circumstances, a problem occurs in that the content addressable memory consumes a lot of electric power. In order to solve such a problem, Unexamined Japanese Patent Application KOKAI Publication No. H9-180468 discloses a content addressable memory, in which data is retrieved in a limited range and a limited number of match detection circuits are activated.

FIG. 3 is a diagram showing the content addressable memory disclosed in Unexamined Japanese Patent Application KOKAI Publication No. H9-180468. This content addressable memory has a function for limiting a retrieval range for the following retrieval based on a result of the previous retrieval. In this function, a retrieval range is limited in a series of retrieval processes immediately upon reception of retrieval data, while outputting the word which has been extracted at the end as a retrieval result. In the series of retrieval processes, a retrieval process performed after the retrieval range is further limited is referred to as the "following retrieval", whereas a retrieval process performed before that is referred to as the "previous retrieval".

The content addressable memory has a memory cell array 2 storing data to be retrieved in the unit of words, an Ω-register 3A and a K-register 3b retaining the retrieval data, a match detection circuit array 4 including match detection circuits $CC_1$ to $CC_{10}$ independent from each word, a retrieval operation determination circuit 5 and a retrieval range limitation circuit 6. The memory cell array 2 stores as data to be retrieved a string table, for example, representing a dynamic dictionary and being formed using a data compression algorithm.

In the series of retrieval processes, after the previous retrieval, the content addressable memory processes a result of the previous retrieval and stores the processed data in the registers 3A and 3B. Before performing the following retrieval, in the content addressable memory, values (information specifying a retrieval range for the following retrieval based on the result of the previous retrieval) which are stored in the registers 3A and 3B are read, and a retrieval range is designated by the retrieval range limitation circuit 6. Accordingly, in the content addressable memory, a word which is in the first position within the retrieval range for the following retrieval can be designated using the result of the previous retrieval.

However, in order for the data stored in the memory cell array 2 to be retrieved based on the retrieval data, in the content addressable memory, the time for storing the values based on the result of the previous retrieval and the time for designating a retrieval range after reading the values stored in the registers 3A and 3B before the following retrieval are required. Therefore, in the content addressable memory, a problem arises in that the previous retrieval is switched over to the following retrieval with loss of time.

Such a content addressable memory requires the registers 3A and 3B storing the values of the previous retrieval and the circuit, for processing the values of the previous retrieval in the retrieval range limitation circuit 6. Obviously, the content addressable memory so needs a large space as to include such registers and circuit, and consumes a lot of electric power.

Furthermore, in the content addressable memory, of a plurality of obtained retrieval results which are assigned priorities, it is difficult to retrieve a retrieval result having the highest priority, since there is not means for designating priorities for the data. Therefore, in the content addressable memory, in a case where the plurality of retrieval results are obtained, the values to be stored in the registers 3A and 3B can not be specified, and the data can not be retrieved after setting a retrieval range.

Unexamined Japanese Patent Application KOKAI Publication No. H9-180469 discloses a content addressable memory in which a limited number of match detection circuits are activated. However, in such a content addressable memory, likewise that disclosed in Unexamined Japanese Patent Application KOKAI Publication No. H9-180468, the previous retrieval is switched over to the following retrieval with loss of time, and a register storing values of the previous retrieval is required, and further priorities for data pieces can not be specified when a plurality of retrieval results are obtained.

SUMMARY OF THE INVENTION

Accordingly, an object of the present invention is to provide a content addressable memory wherein a retrieval range for the following retrieval based on a result of the previous retrieval is optimized.

Another object thereof is to provide a content addressable memory wherein the time required to switch the previous retrieval to the following can be shortened.

Still another object thereof is to provide a content addressable memory wherein a hardware structure for limiting a retrieval range is simply made, thus a decrease in the consumption power can be expected.

In order to achieve the above-described objects, according to the first aspect of the present invention, there is provided a content addressable memory which retrieves, of a plurality of words stored as data to be retrieved, a word having relevance to retrieval data, the memory comprising:

a memory cell array which stores words as data to be retrieved at a plurality of addresses each of which is assigned a priority in ascending or descending order;

a relevance detection circuit array which includes a plurality of relevance detection circuits respectively corresponding to the plurality of words stored in the memory cell array and each detecting whether there is any relevance between the input retrieval data and the words;

a priority circuit which retains a highest priority assigned to one of the plurality of addresses corresponding to a word which has relevance to the retrieval data as detected by the relevance detection circuits included in the relevance detection circuit array; and a retrieval range designation circuit which designates the relevance detection circuits included in the relevance detection circuit array to detect whether there is any relevance between the retrieval data and the words in a following retrieval, in accordance with priorities retained by the priority circuit.

The content addressable memory may further comprise an address encoder which encodes and outputs the address corresponding to the priority retained by the priority circuit.

In the content addressable memory, each of the relevance detection circuits included in the relevance detection circuit array may output to the priority circuit a signal being in an active state and indicating a retrieval result, when there is relevance between the retrieval data and the corresponding word;

the priority circuit may retain and output to the address encoder, of signals each indicating a retrieval result and output from the relevance detection circuits, a signal whose address is assigned a highest priority;

the address encoder may encode and output an address corresponding to the signal indicating the retrieval result and output from the priority detection circuit;

the retrieval range designation circuit may receive the signal indicating the retrieval result and retained by the priority circuit, and designate which relevance detection circuit included in the relevance detection circuit array to detect relevance between the retrieval data and the word.

In the content addressable memory:

each of the relevance detection circuits included in the relevance detection circuit array may detect, for example, whether the input retrieval data matches the corresponding word; and each of the relevance detection circuits included in the relevance detection circuit array may detect whether a part of bits of the input retrieval data matches a part of bits of the corresponding word.

In the content addressable memory, the retrieval range designation circuit may designate an address included in the memory cell array and assigned a higher priority than the priority retained by the priority circuit, as an address not to be detected by the relevance detection circuit array in a following retrieval.

In the content addressable memory, each of the relevance detection circuits included in the relevance detection circuit array may include a mask circuit which so masks that a retrieval result indicating relevance between the retrieval data and the corresponding word is not output. In this case, the retrieval range designation circuit may control one or more mask circuits, to mask output data, each corresponding to an address which is included in the memory cell array and which is assigned a higher priority than a priority retained by the priority circuit in the following retrieval.

In the content addressable memory, the priority circuit may retain a highest priority among any other priorities assigned to addresses which correspond to words detected whether to have relevance to the input retrieval data, during a period of time since a detection result is acquired from the relevance detection circuit until the following retrieval beings. In this case, the retrieval range designation circuit may receive the priority retained by the priority circuit at a timing the following retrieval beings, and designate which relevance detection circuit included in the relevance detection circuit array to detect relevance between the retrieval data and the word in accordance with the received priority.

In order to achieve the above-described objects, according to the second aspect of the present invention, there is provided a data retrieval method, in a content addressable memory which retrieves a word stored, as data to be retrieved, at a plurality of addresses respectively assigned a plurality of priorities in ascending or descending order, on the basis of input retrieval data, the method comprising:

detecting the word which is stored as data to be retrieved and has relevance to the input retrieval data;

retaining a highest priority among a plurality of priorities which are assigned to addresses corresponding to a word detected whether to have relevance to the input retrieval data; and designating which one of words stored as data to be retrieved is detected whether to have relevance to the retrieval data, in accordance with the retained priority.

The data retrieval method in the content addressable memory may comprise designating an address included in a memory cell array and assigned a priority higher than the retained priority, as an address not to be detected in a following retrieval whether to have relevance to the retrieval data.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENT

An embodiment of the present invention will now be explained with reference to the accompanying drawings.

Figure 1:
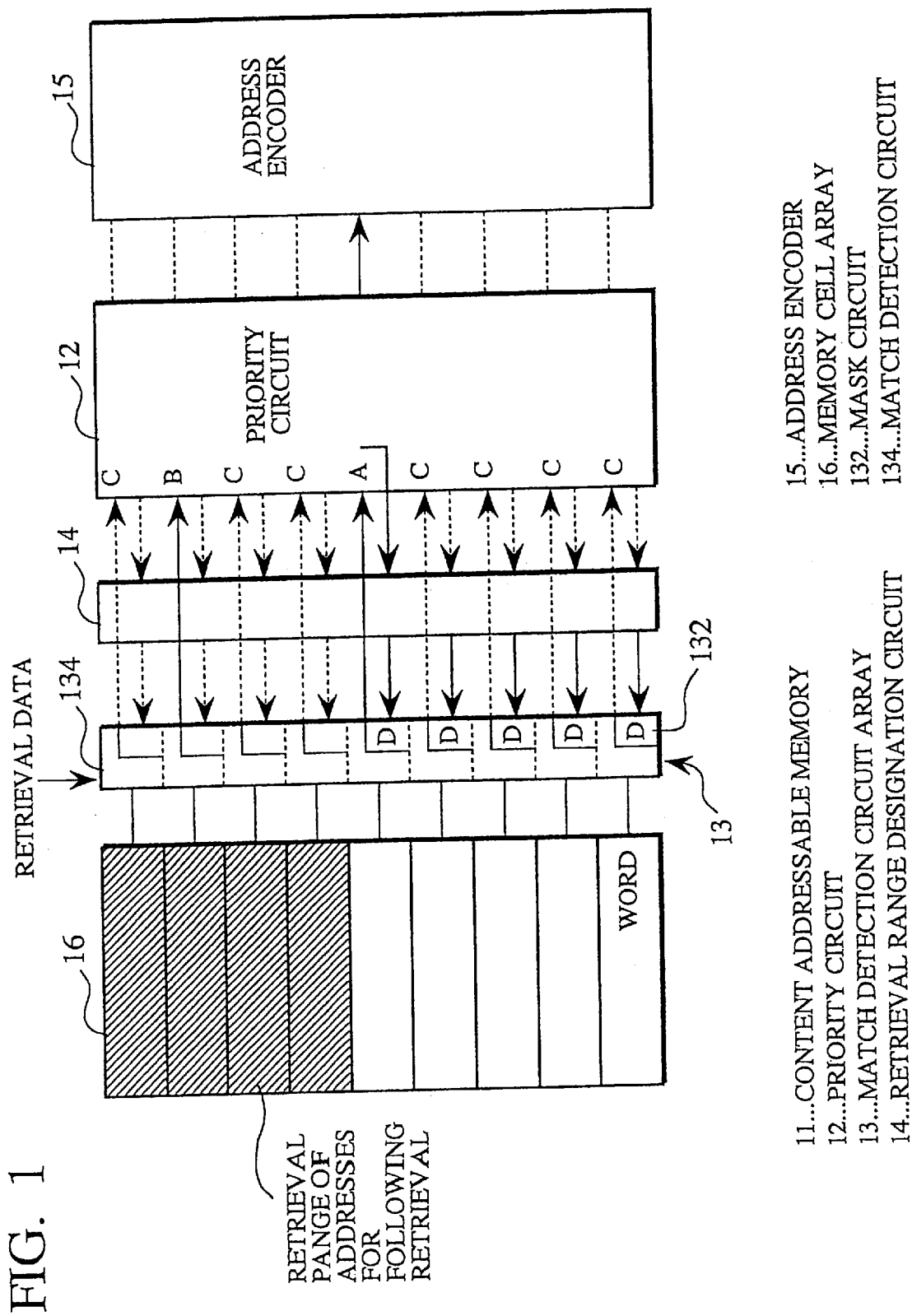
FIG. 1 is a diagram illustrating a content addressable memory according to an embodiment of the present invention.
Figure 2:
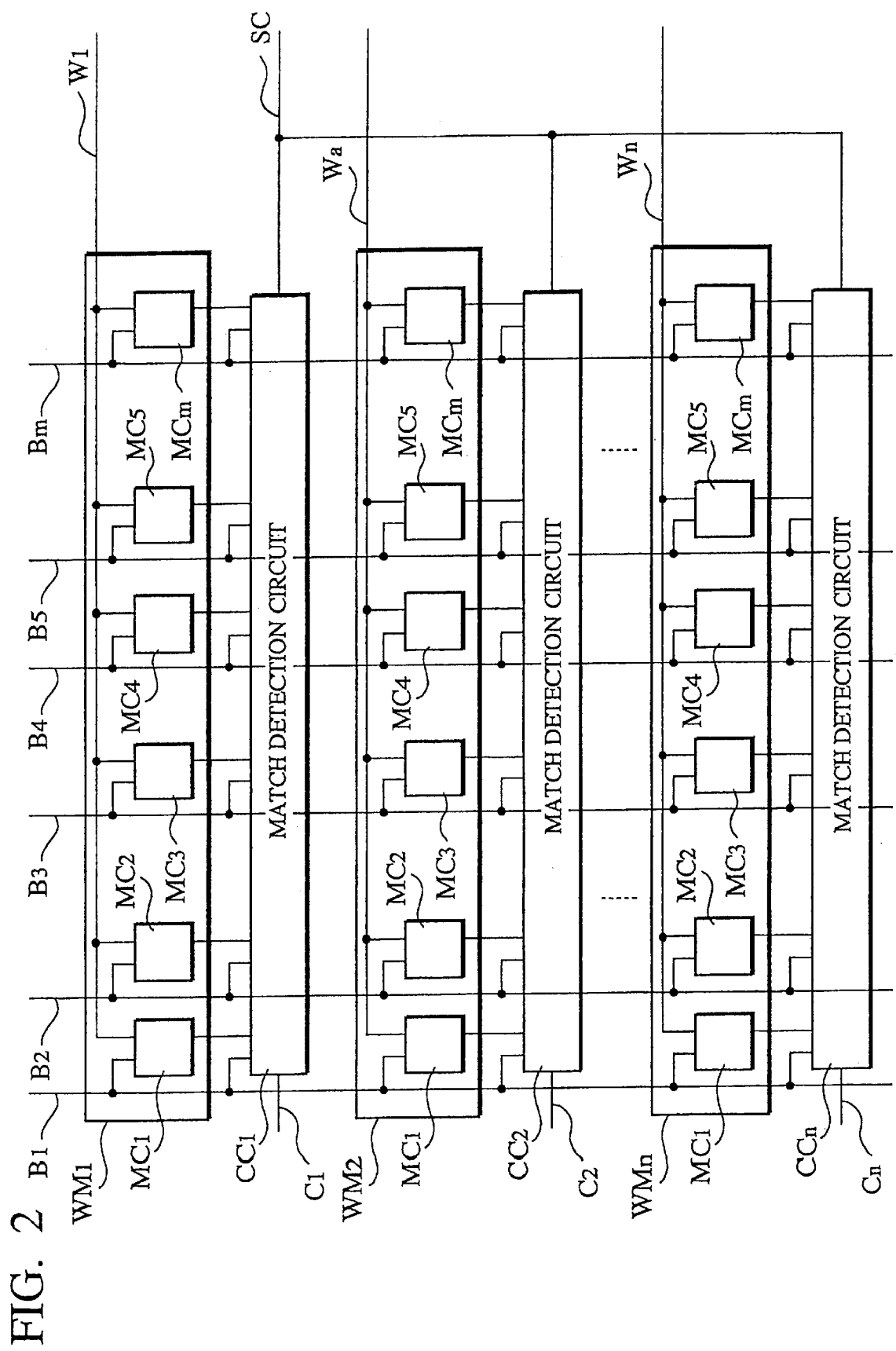
FIG. 2 is a diagram illustrating a conventional content addressable memory.

FIG. 1 is a diagram illustrating a content addressable memory according to the embodiment of the present invention. In the illustration, the content addressable memory includes a priority circuit 12, a match detection circuit array 13 wherein a plurality of mask circuits 132 and match detection circuits 134 are all included and respectively correspond to a plurality of addresses of a memory cell array 16, a retrieval range designation circuit 14, an address encoder 15 and the memory cell array 16.

The memory cell array 16 stores words as data to be retrieved at each address. The addresses of the memory cell array 16 are assigned priorities in descending order. The priority, by definition, is means for representing at what level data to be retrieved corresponds to retrieval data. For example, the term "high priority" expresses that data to be retrieved corresponds to retrieval data at a high level, while the term "low priority" expresses that data to be retrieved corresponds to retrieval data at a low level or does not correspond thereto. In a case where a signal indicating a retrieval result is a plurality of bits, the signal may represent information specifying at what level the data to be retrieved corresponds to the retrieval data. Of signals respectively indicating retrieval results, one signal which indicates the most similar retrieval result to the retrieval data can be defined as having an address assigned the highest priority. In a case where the retrieval data, the first data to be retrieved and the second data to be retrieved respectively have the values "0010", "0011" and "0110", their corresponding signals each indicating a retrieval result specify subtraction sums of the retrieval data and the first and second data to be retrieved, as "0001" and "0100". Such signals indicating retrieval results having the values "0001" and "0100" are input to the priority circuit 12. The priority circuit 12 determines, as a signal having an addresses assigned the highest priority, one signal whose subtraction sum is the smallest difference to the retrieval data, that is, the data to be retrieved having the value "0011" which is the most closest data to the retrieval data. After the determination, the priority circuit 12 sends the determined signal to the retrieval range designation circuit 14. The retrieval range designation circuit 14 designates, as the next retrieval range, smaller addresses, with respect to the address assigned the highest priority, thereby to mask output from the match detection circuit 134 corresponding to the address, which is assigned the highest priority, or larger addresses, with respect to the address assigned the highest priority.

The priority circuit 12 is connected to the match detection circuit 134, the retrieval range designation circuit 14 and the address encoder 15. The priority circuit 12 retains, of signals (which is denoted by either symbol A or B in the illustration) indicating a retrieval result and being output from the match detection circuit 134, a signal (denoted by a symbol A) indicating a retrieval result and having an address which is assigned the highest priority, until the following retrieval begins, and outputs the signal to the retrieval range designation circuit 14. The priority circuit 12 outputs to the address encoder 15 the signal having the address which is assigned the highest priority.

The plurality of match detection circuits 134 are connected to the memory cell array 16, the priority circuit 12 and the retrieval range designation circuit 14, and receives retrieval data which has been externally input. Each of the match detection circuits 134 detects whether the input retrieval data matches a word which is stored at a corresponding address of the memory cell array 16. When determined that the input retrieval data matches the word, the match detection circuit 134 outputs an enable signal being in an active state and indicating a retrieval result to the priority circuit 12. The match detection circuits 134 respectively include the mask circuits 132.

Upon reception of an enable signal being in an active state from the retrieval range designation circuit 14, each of the mask circuits 132 masks (denoted by a symbol D) the retrieval result sent from the match detection circuit 134. Then, each of the mask circuit 132 controls the signal indicating the retrieval result not to be output from each of the match detection circuit 134 to the priority circuit 12. Thereafter, the retrieval range designation circuit 14 designates a retrieval range (in the illustration, the shaded portion represents a retrieval range, as a following retrieval range) for the following retrieval.

The address encoder 15 which is connected to the priority circuit 12 encodes and outputs an address corresponding to a signal, which indicates a retrieval result and which is assigned the highest priority, output by the priority circuit 12.

The retrieval range designation circuit 14 is connected to the priority circuit 12 and the match detection circuit 134. The retrieval range designation circuit 14 receives the signal which indicates the retrieval result and whose address is assigned the highest priority and retained by the priority circuit 12, at the timing of a clock signal being risen high when the following retrieval begins. The retrieval range designation circuit 14 outputs a signal which controls each of the mask circuits 134 to be in an active state, in accordance with the received signal indicating the retrieval result.

Operations of the content addressable memory according to this embodiment will now be explained.

When retrieval data is input to each of the match detection circuits 134 included in the match retrieval array 13, each of the match detection circuits 134 detects whether words stored at the respectively corresponding addresses of the memory cell array 16 match the retrieval data. When detected that the words match the retrieval data, the match detection circuits 134 generate and output a signal (denoted by either symbol A or B in the illustration) indicating the retrieved result to the priority circuit 12.

The priority circuit 12 selects and retains, of the signals indicating the retrieval result and output from the match detection circuits 134, one signal (denoted by a symbol A in the illustration) whose address is assigned the highest priority, and outputs the signal to the address encoder 15. The address encoder 15 encodes and outputs a value of the address corresponding to the signal. This will be the end of the previous retrieval.

When a clock signal is risen high, leading the following retrieval to begin, the retrieval range designation circuit 14 receives the signal indicating the retrieval result and being retained by the priority circuit 12. The retrieval range designation circuit 14 outputs an enable signal which controls output data to be masked. An address (shown in the lower portion in the illustration) corresponding to the output data to be masked is assigned a priority which is higher than a priority assigned to an addresses corresponding to the received signal. When the retrieval range designation circuit 14 inputs the enable signal to the mask circuit 132, the mask circuit 132 so masks (denoted by symbols D in the illustration) the signal that the signal indicating the retrieval result is not output from the match detection circuits 134 to the priority circuit 12. The plurality of match detection circuits 134 detect, in the following retrieval, whether retrieval data matches a word stored within a range of addresses, which are included in the memory cell array 16, which are limited as represented by the shaded portion in FIG. 1.

The content addressable memory, having the above-described structure and the operations, according to this embodiment advantageously has the functions, as follows:

First, the content addressable memory of this invention directly refers to a value which has been obtained as a result of the previous retrieval so as to determine a retrieval range of words in the memory cell array 16 for the following retrieval. In other words, the content addressable memory optimizes the retrieval range for the following retrieval based on the result of the previous retrieval.

Figure 3:
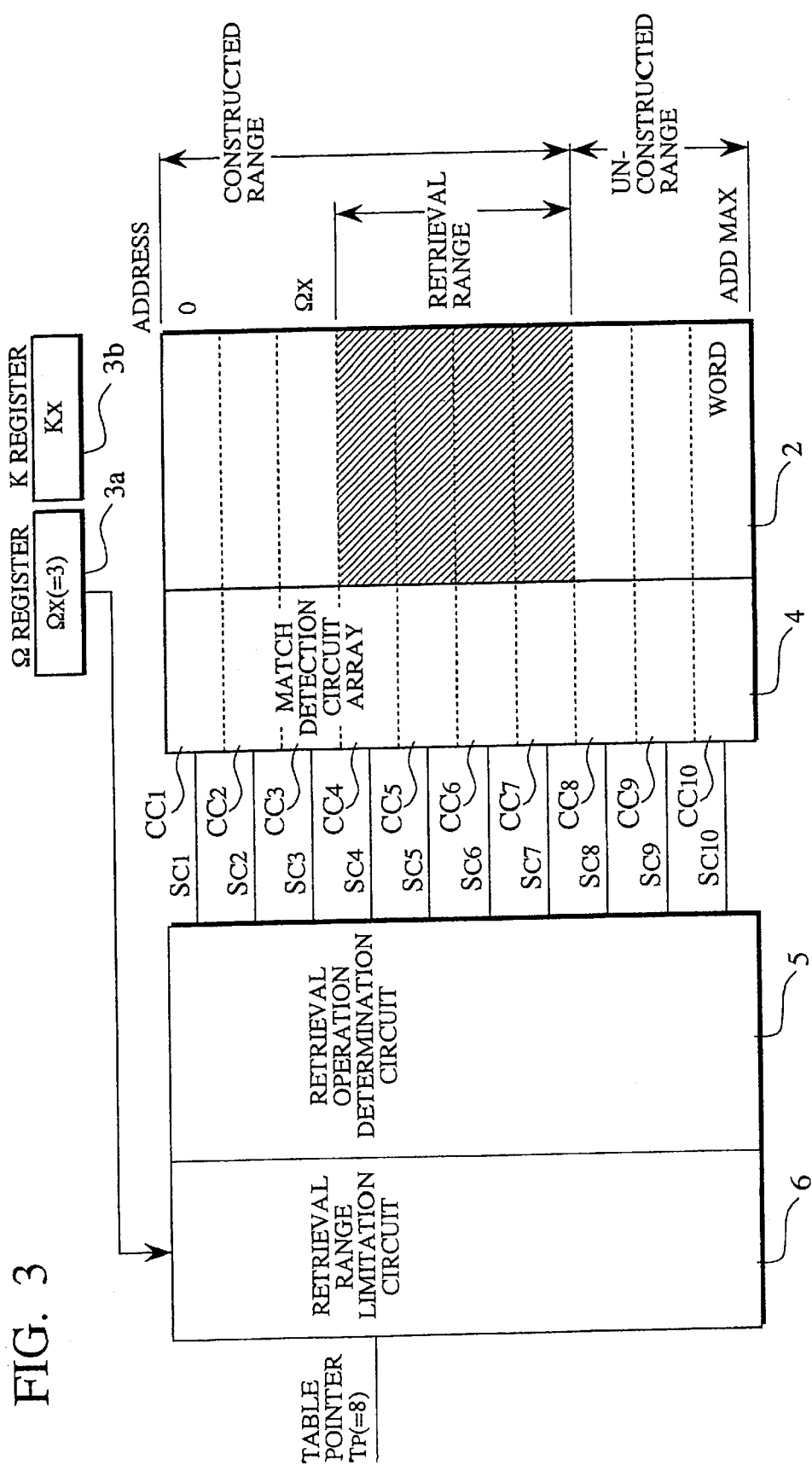
FIG. 3 is a diagram illustrating another conventional content addressable memory.

Second, the content addressable memory of this invention directly refers to a value which has been obtained as a result of the previous retrieval so as to determine a retrieval range of words in the memory cell array 16 for the following retrieval. Unlike the conventional content addressable memory shown in FIG. 3, the content addressable memory of this invention is not required to perform a series of processes for storing in a register the value obtained as the result of the previous retrieval, for reading out the value from the register, for calculating a retrieval range based on the readout value, for outputting the calculated result, and for designating the retrieval range. Thus, the content addressable memory of this invention can execute the following retrieval immediately upon execution of the previous retrieval. Therefore, as compared with the conventional content addressable memory shown in FIG. 3, for the content addressable memory of this invention, the shorter time is needed for the entire following retrieval process.

Third, the content addressable memory of this invention need not include a circuit for processing a retrieved value and a register for storing the value. In consideration of this, the content addressable memory of this invention has the simpler hardware structure than that of the conventional content addressable memory, requires a small space to be operated, and consumes little power.

In the above-described embodiment, an explanation has been exemplarily made to a case where each of the addresses of the memory cell array 16 is assigned a priority in descending order. However, the above-described structure is also applicable to a content addressable memory, in which each address of the memory cell array 16 is assigned a priority in ascending order.

In the above-described embodiment, each of the match detection circuits 134 masks the signal indicating a detected result whether the retrieval data matches a word within a range of addresses, by means of the mask circuit 132, thereby determining a retrieval range and a non-retrieval range included in the memory cell array 16. However, the match detection circuits 134 is not limited to such a process, and may be suspended from performing the process, in a case, for example, where a signal in an active state is supplied from the retrieval range designation circuit 14.

In the above-described embodiment, each of the match detection circuits 134 detects whether input retrieval data entirely matches a corresponding word. However, each of the above may detect whether a part of bits of the input retrieval data matches a part of bits of the corresponding word. According to such a structure, each of the match detection circuits 134 can detect not only whether the input retrieval data matches the word stored at each of the addresses of the memory cell array 16, but also whether there are any words similar to the input retrieval data at the addresses of the memory cell array 16.

In place of the above-described match detection circuits 134, the content addressable memory of this invention may employ a circuit which detects whether the input retrieval data has relevance to the word stored at each address of the memory cell array 16. For example, in a case where two bits in a certain position of a bit row of the retrieval data have the same value (e.g., "00"), if two bits in a corresponding position of a bit row of the word having the same value (either "00" or "11"), it can be determined that there is relevance between the retrieval data and the word.

Various embodiments and changes may be made thereonto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. H11-009800 filed on Jan. 18, 1999 and including specification, claims, drawings and summary. The disclosure of the above Japanese Patent Application is incorporated herein by reference in its entirety.

What is claimed is:

1. A content addressable memory which retrieves, of a plurality of words stored as data to be retrieved, a word having relevance to retrieval data, said memory comprising:
   a memory cell array which stores words as data to be retrieved at a plurality of addresses each of which is assigned a priority in ascending or descending order;
   a relevance detection circuit array which includes a plurality of relevance detection circuits respectively corresponding to the plurality of words stored in said memory cell array and each detecting whether there is any relevance between the input retrieval data and the words;
   a priority circuit which retains a highest priority assigned to one of the plurality of addresses corresponding to a word which has relevance to the retrieval data as detected by the relevance detection circuits included in said relevance detection circuit array; and
   a retrieval range designation circuit which designates the relevance detection circuits included in said relevance detection circuit array to detect whether there is any relevance between the retrieval data and the words in a following retrieval, in accordance with priorities retained by said priority circuit.

2. The content addressable memory according to claim 1, further comprising an address encoder which encodes and outputs the address corresponding to the priority retained by said priority circuit.

3. The content addressable memory according to claim 2, wherein:
   each of the relevance detection circuits included in said relevance detection circuit array outputs to said priority circuit a signal being in an active state and indicating a retrieval result, when there is relevance between the retrieval data and the corresponding word;

said priority circuit retains and outputs to said address encoder, of signals each indicating a retrieval result and output and output from the relevance detection circuits, a signal whose address is assigned a highest priority;

said address encoder encodes and outputs an address corresponding to the signal indicating the retrieval result and output from said priority detection circuit;

said retrieval range designation circuit receives the signal indicating the retrieval result and retained by said priority circuit, and designates which relevance detection circuit included in said relevance detection circuit array to detect relevance between the retrieval data and the word.

4. The content addressable memory according to claim 1, wherein each of the relevance detection circuits included in said relevance detection circuit array detects whether the input retrieval data matches the corresponding word.

5. The content addressable memory according to claim 1, wherein each of the relevance detection circuits included in said relevance detection circuit array detects whether a part of bits of the input retrieval data matches a part of bits of the corresponding word.

6. The content addressable memory according to claim 1, wherein said retrieval range designation circuit designates an address included in said memory cell array and assigned a higher priority than the priority retained by said priority circuit, as an address not to be detected by said relevance detection circuit array in a following retrieval.

7. The content addressable memory according to claim 1, wherein:

each of the relevance detection circuits included in said relevance detection circuit array includes a mask circuit which so masks that a retrieval result indicating relevance between the retrieval data and the corresponding word is not output; and said retrieval range designation circuit controls one or more mask circuits, to mask output data, each corresponding to an address which is included in said memory cell array and which is assigned a higher priority than a priority retained by said priority circuit in the following retrieval.

8. The content addressable memory according to claim 1, wherein:

said priority circuit retains a highest priority among any other priorities assigned to addresses which correspond to words detected whether to have relevance to the input retrieval data, during a period of time since a detection result is acquired from said relevance detection circuit until the following retrieval beings;

said retrieval range designation circuit receives the priority retained by said priority circuit at a timing the following retrieval beings, and designates which relevance detection circuit included in said relevance detection circuit array to detect relevance between the retrieval data and the word in accordance with the received priority.

9. A data retrieval method, in a content addressable memory which retrieves a word stored, as data to be retrieved, at a plurality of addresses respectively assigned a plurality of priorities in ascending or descending order, on the basis of input retrieval data, said method comprising:

detecting the word which is stored as data to be retrieved and has relevance to the input retrieval data;

retaining a highest priority among a plurality of priorities which are assigned to addresses corresponding to a word detected whether to have relevance to the input retrieval data; and designating which one of words stored as data to be retrieved is detected whether to have relevance to the retrieval data, in accordance with the retained priority.

10. The data retrieval method in the content addressable memory according to claim 9, said method comprising designating an address included in a memory cell array and assigned a priority higher than the retained priority, as an address not to be detected in a following retrieval whether to have relevance to the retrieval data.

* * * * *